United States Patent [19]
Takaoka et al.

[11] Patent Number: 6,139,979
[45] Date of Patent: Oct. 31, 2000

[54] LEAD-FREE SOLDER AND SOLDERED ARTICLE

[75] Inventors: Hidekiyo Takaoka, Shiga-ken; Kiyotaka Maegawa, Hikone, both of Japan

[73] Assignee: Murata Manufacturing Co., Ltd., Japan

[21] Appl. No.: 09/289,449

[22] Filed: Apr. 9, 1999

[30] Foreign Application Priority Data

Jan. 28, 1999 [JP] Japan .................................. 11-020044

[51] Int. Cl.⁷ .............................. B32B 15/01; C22C 13/02
[52] U.S. Cl. ........................ 428/646; 174/263; 257/772; 420/560; 420/561; 420/562; 428/644; 428/647; 428/648
[58] Field of Search ..................................... 428/646, 643, 428/644, 647, 648; 420/560, 561, 562; 174/263; 257/772

[56] References Cited

U.S. PATENT DOCUMENTS 5,837,191  11/1998  Gickler ..................................... 420/560
5,863,493  1/1999   Achari et al. .......................... 420/560

FOREIGN PATENT DOCUMENTS

| 3830694A1 | 3/1990 | Germany . |
| 19816671A1 | 10/1998 | Germany . |
| 1981671A1 | 10/1998 | Germany . |
| 61-88996 | 5/1986 | Japan . |
| 1548755 | 7/1979 | United Kingdom . |

*Primary Examiner*—Deborah Jones
*Assistant Examiner*—Robert R. Koehler
*Attorney, Agent, or Firm*—Ostrolenk, Faber, Gerb & Soffen, LLP

[57] ABSTRACT

A lead-free solder contains nickel, silver and tin. A soldered article is a workpiece containing a transition metal conductor capable of readily diffusing into melted tin; and the lead-free solder; wherein the lead-free solder is applied and bonded to the workpiece so as to be electrically and mechanically bonded to the transition metal conductor. The lead-free solder and soldered article barely cause electrode erosion during soldering or during aging after soldering, and have high tensile strength and thermal impact resistance.

4 Claims, No Drawings

LEAD-FREE SOLDER AND SOLDERED ARTICLE

BACKGROUND OF THE INVENTION

1. Field of the Invention

The present invention relates to lead-free solders and soldered articles.

2. Description of the Related Art

Solders have been conventionally used for achieving an electrical and mechanical joint to electronic devices and electronic parts. Solders containing tin and lead as major components have been generally used. In addition, solders not containing lead, so called "lead-free solders", which contain tin as a major component and other components such as silver, bismuth, copper, indium and antimony, are being used in consideration of environmental problems. In recent years, soldered articles provided with electrical joints having satisfactory soldering characteristics have been produced using such lead-free solders.

However, solders containing tin as a major component, particularly lead-free solders, readily form electrode erosion at electrical joints during soldering or during thermal aging after soldering. When components readily diffusing into tin are used in compositions of electrodes to be soldered, electrode erosion will be further prompted.

Lead-free solders containing tin and silver as major components also have been proposed; however, hard tin-silver alloys will be further hardened so that plastic deformability is significantly decreased by addition of nickel for the purpose of improved electrode erosion resistance during soldering.

SUMMARY OF THE INVENTION

It is an object of the present invention to provide a lead-free solder and a soldered article which barely cause electrode erosion during soldering or during aging after soldering, and have high tensile strength and thermal impact resistance.

To achieve the above object, a preferred embodiment of the present invention provides a lead-free solder comprising about 0.01 to 0.5 percent by weight of nickel; about 0.5 to 3.39 percent by weight of silver; and about 96.6 percent by weight or more of tin. The lead-free solder may contain trace amounts of incidental impurities in addition to the above components. Examples of the incidental impurities include lead, bismuth, copper and sodium.

Another preferred embodiment of the present invention provides a lead-free solder comprising about 0.01 to 0.5 percent by weight of nickel; about 0.5 to 2.0 percent by weight of copper; about 0.5 to 2.89 percent by weight of silver; and about 96.6 percent by weight or more of tin. The lead-free solder may contain trace amounts of incidental impurities in addition to the above components. Examples of the incidental impurities include lead, bismuth and sodium.

Still another preferred embodiment of the present invention provides a lead-free solder comprising about 0.01 to 0.5 percent by weight of nickel; at least one component selected from about 0.5 to 2.0 percent by weight of copper and about 0.5 to 5.0 percent by weight of antimony; and the balance being tin. The lead-free solder may contain trace amounts of incidental impurities in addition to the above components. Examples of the incidental impurities include lead, bismuth and sodium.

Still another preferred embodiment of the present invention provides a soldered article comprising: a workpiece containing a transition metal conductor capable of readily diffusing into melted tin; and a lead-free solder according to any one of the above described preferred embodiments; the lead-free solder being applied and bonded to the workpiece so as to be electrically and mechanically bonded to the transition metal conductor.

In the above described soldered article, the transition metal conductor may be at least one component selected from the group consisting of copper, silver, nickel, gold, palladium, platinum, zinc and alloys thereof.

As described above, the lead-free solder in accordance with the present invention prevents electrode erosion and has superior thermal impact resistance while maintaining required soldering characteristics, bonding strength, solder tensile strength and solder contraction, even when it is used for bonding of parts containing transition metal conductors which are readily eroded.

The soldered article in accordance with the present invention comprises a workpiece containing a transition metal conductor capable of readily diffusing into melted tin and a lead-free solder, and the lead-free solder is applied and bonded to the workpiece so as to be electrically and mechanically bonded to the transition metal conductor. Thus, the lead-free solder in accordance with the present invention prevents electrode erosion and has superior thermal impact resistance while maintaining required soldering characteristics, bonding strength, solder tensile strength and solder contraction to a transition metal conductor which readily diffuses into melted tin.

In the soldered article in accordance with the present invention, the transition metal conductor is at least one component selected from the group consisting of copper, silver, nickel, gold, palladium, platinum, zinc and alloys thereof. Thus, the lead-free solder in accordance with the present invention prevents electrode erosion and has superior thermal impact resistance while maintaining required soldering characteristics, bonding strength, solder tensile strength and solder contraction to a transition metal conductor which readily diffuses into melted tin.

Soldering is often performed in a $N_2$ atmosphere for improving soldering characteristics. Since the lead-free solder in accordance with the present invention has a low nickel content, soldering can be readily performed in air. Thus the solder has superior soldering workability.

The lead-free solder in accordance with the present invention contains small amounts of expensive erosion-suppressing elements such as silver; hence, the soldering cost can be reduced compared to conventional lead-free solders.

In the lead-free solder in accordance with the present invention, the nickel content is preferably in a range of about 0.01 to 0.5 percent by weight with respect to the total of 100 percent by weight. When the nickel content is less than about 0.01 percent by weight, electrode erosion resistance decreases and thus the residual area of the electrode during soldering decreases. On the other hand, when the nickel content is higher than about 0.5 percent by weight, the liquidus line of the lead-free solder increases, resulting in unsuccessful bridging and poor appearance in soldering at the same temperature. Soldering at higher temperatures in order to avoid such problems causes characteristic defects of electronic components due to intense heat.

In the Sn—Ni—Cu ternary or Sn—Ni—Ag—Cu quaternary lead-free solder in accordance with the present invention, the copper content is preferably in a range of about 0.5 to 2.0 percent by weight with respect to the total of 100 percent by weight. When the copper content is less than about 0.5 percent by weight, bonding strength is not effectively improved. On the other hand, when the copper content is higher than about 2.0 percent by weight, the bonding strength decreases due to excess precipitation of hard and brittle metallic compounds, such as $Cu_6Sn_5$ and $Cu_3Sn$. Furthermore, the liquidus line of the lead-free solder increases, resulting in unsuccessful bridging and poor appearance in soldering at the same temperature. Soldering at higher temperatures in order to avoid such problems causes characteristic defects of electronic components due to intense heat. In addition, some problems arise due to decreased tin and nickel contents.

In the Sn—Ni—Ag ternary lead-free solder in accordance with the present invention, the silver content is preferably in a range of about 0.5 to 3.39 percent by weight with respect to the total of 100 percent by weight. When the silver content is less than about 0.5 percent by weight, bonding strength is not effectively improved. On the other hand, when the silver content is higher than about 3.39 percent by weight, the bonding strength decreases due to excess precipitation of hard metallic compounds, such as $Ag_3Sn$. Furthermore, the liquidus line of the lead-free solder increases, resulting in unsuccessful bridging and poor appearance in soldering at the same temperature. Soldering at higher temperatures in order to avoid such problems causes characteristic defects of electronic components due to intense heat. In addition, some problems arise due to decreased tin and nickel contents.

In the Sn—Ni—Ag—Cu quaternary lead-free solder in accordance with the present invention, the silver content is preferably in a range of about 0.5 to 2.89 percent by weight with respect to the total of 100 percent by weight. When the silver content is less than about 0.5 percent by weight, bonding strength is not effectively improved. On the other hand, when the silver content is higher than about 2.89 percent by weight, the total content of silver and copper is higher than about 3.39 percent by weight, and the bonding strength decreases due to co-precipitation of hard metallic compounds, such as $Ag_3Sn$, $Cu_6Sn_5$ and $Cu_3Sn$. In addition, some problems arise due to decreased tin and nickel contents.

In the Sn—Ni—Sb ternary lead-free solder in accordance with the present invention, the antimony content is preferably in a range of about 0.5 to 5.0 percent by weight with respect to the total of 100 percent by weight. When the antimony content is less than about 0.5 percent by weight, bonding strength is not effectively improved. On the other hand, when the antimony content is higher than about 5.0 percent by weight, the tensile strength of the solder decreases, resulting in decreased thermal impact resistance and workability. In addition, some problems arise due to decreased tin and nickel contents.

In the soldered article in accordance with the present invention, the transition metal conductor is at least one component selected from the group consisting of copper, silver, nickel, gold, palladium, platinum, zinc and alloys thereof. Examples of the alloys include gold-silver and gold-platinum. More preferably, the conductor is composed of copper, silver, nickel or an alloy thereof.

The soldered article in accordance with the present invention includes both a component to be bonded and a lead-free solder electrically and mechanically bonded to the transition metal conductor being the component. Examples of such articles include a combination of a conductor formed on a board for mounting components and a conductor formed of a component which are electrically and mechanically bonded to each other; a combination of electronic parts and terminals electrically and mechanically bonded thereto; and a combination of electrically and mechanically connected terminals of electronic parts.

The soldered article in accordance with the present invention can be prepared by, for example, melting a lead-free solder in accordance with the present invention to form a solder ball, placing the solder ball on a part, applying a flux thereto, and then heating them to a predetermined temperature in the atmosphere to bond the conductor of the part. Alternatively, it can be prepared by melting a lead-free solder at a temperature higher than the liquid phase temperature in a soldering vessel, and dipping a flux-coated part into the statistic melted solder to bond conductors of the part by dip soldering. Alternatively, it can be prepared by melting a lead-free solder in accordance with the present invention at a temperature higher than the liquid phase temperature in a jet solder vessel and putting a flux-coated part contact with the melted solder to bond the conductors of the part by flow soldering. When the part is dipped into the lead-free solder, the part may be swung in the melted solder. The number of contacts of the part with the melted solder is not limited.

Examples of parts for bonding the lead-free solder in accordance with the present invention include glass-epoxy or phenolic printed boards, ceramic boards made of alumina or mulite and metal boards with insulating films provided thereon. Examples of conductors composed of transition metals to be electrically bonded to the lead-free solder includes wiring circuits of printed boards and the like, terminal electrodes of electronic parts, and lead terminals.

DESCRIPTION OF THE PREFERRED EMBODIMENT

The lead-free solder and the soldered article in accordance with the present invention will be described in detail with reference to the Examples.

Tin, lead, nickel, silver, copper and antimony were mixed according to the formulations shown in Table 1 to prepare a plurality of solders of Examples 1 to 12 and Comparative Example 1 to 7.

A plurality of single-plate capacitors provided with a sintered Cu electrode and a sintered Ag electrode was prepared to measure electrostatic capacitance. Each capacitor was dipped into one of the solders of Examples 1 to 12 and Comparative Examples 1 to 7, which were melted at 260° C. The difference in the electrostatic capacitance of the single-plate capacitor before and after solder dipping was measured by a capacitance law method, and the residual area rate of the electrode was calculated after dipping. The change in capacitance was measured after dipping for 10 seconds for the copper electrode and 3 seconds for the silver electrode which is readily eroded.

The expansion rates of the solders of Examples 1 to 12 and Comparative Examples 1 to 7 were measured according to Japanese Industrial Standard (JIS) Z3197. The measured temperature was the liquidus line temperature plus 30° C. in consideration of workability.

A copper plate was sandwiched with copper lead lines in which the surfaces were plated with tin, and dipped into one of the solders of Examples 1 to 12 and Comparative Examples 1 to 7 which were previously melted at 250° C. to prepare test pieces of Examples 1 to 12 and Comparative Examples 1 to 7. The tensile strength of these test pieces were measured by stretching the copper lead lines using a tensilometer.

The solders of Examples 1 to 12 and Comparative Examples 1 to 7 were heated to be melted to the liquidus temperature plus 100° C., cast into graphite molds, solidified and then aged for 148 hours at ordinary temperature to prepare test pieces of Examples 1 to 12 and Comparative Examples 1 to 7. These test pieces were stretched at a tensile rate of 5 mm/s to measure tensile strength of the solders. Each test piece had a flat plate shape and the tested portion had a rectangular cross-section of 8×3 mm without notch.

The cross-section of each of the test pieces of Examples 1 to 12 and Comparative Examples 1 to 7 after the tensile test was measured to determine the solder contraction according to JIS Z2241 (Paragraph 6.11).

A thick silver electrode was formed on an $Al_2O_3$ substrate. The substrate was sandwiched with tin-plated copper lead lines, and dipped into one of the solders of Examples 1 to 12 and Comparative Examples 1 to 7 which were melted at 260° C. The soldered substrate was placed into a thermal impact vessel and then was subjected to 500 cycles of thermal impact in which one cycle includes holding at −30° C. for 30 minutes and +125° C. for 30 minutes. The surface cracks of the fillets of Examples 1 to 12 and Comparative Examples 1 to 7 were visually observed to determine the thermal impact resistance. The side of the lead line was soldered to a glass-epoxy substrate and the side of the fillet formed on the substrate was evaluated. In the evaluation of the thermal impact resistance, symbol O means no crack is formed.

Table 1 shows the results of the residual area rate of the electrode, the expansion rate, the bonding strength, the tensile strength of the solder, the contraction rate of the solder and the thermal impact resistance. The lead-free solders and the soldered articles within the range of the present invention show satisfactory results by overall rating which are represented by symbol O.

TABLE 1

| Sample | | Metal conductor | | | | | Residual area rate (%) of electrode | | Expansion rate (%) | Bonding strength (N) | Tensile strength of solder (N · mm$^{-2}$) | Contraction (%) | Thermal impact resistance | Overall rating |
|---|---|---|---|---|---|---|---|---|---|---|---|---|---|---|
| | | Sn | Pb | Ni | Ag | Cu | Sb | Cu electrode | Ag electrode | | | | | | |
| Example | 1 | 99.35 | | 0.15 | 0.50 | | | 99.5 | 60.0 | 71 | 18.8 | 32 | 82 | ○ | ○ |
| | 2 | 99.15 | | 0.15 | 0.70 | | | 99.6 | 62.0 | 71 | 19.0 | 38 | 80 | ○ | ○ |
| | 3 | 97.85 | | 0.15 | 2.00 | | | 99.2 | 59.8 | 73 | 17.4 | 52 | 68 | ○ | ○ |
| | 4 | 99.35 | | 0.15 | | | 0.50 | 97.9 | 58.5 | 71 | 20.0 | 34 | 74 | ○ | ○ |
| | 5 | 96.85 | | 0.15 | | | 3.00 | 98.8 | 59.0 | 71 | 21.3 | 44 | 70 | ○ | ○ |
| | 6 | 94.85 | | 0.15 | | | 5.00 | 98.9 | 60.0 | 71 | 21.0 | 52 | 66 | ○ | ○ |
| | 7 | 99.49 | | 0.01 | 0.50 | | | 98.5 | 71.0 | 71 | 18.8 | 34 | 80 | ○ | ○ |
| | 8 | 96.11 | | 0.50 | 3.39 | | | 99.8 | 84.0 | 68 | 19.8 | 49 | 59 | ○ | ○ |
| | 9 | 98.35 | | 0.15 | 1.00 | 0.50 | | 99.4 | 80.0 | 73 | 21.0 | 50 | 77 | ○ | ○ |
| | 10 | 97.15 | | 0.15 | 2.00 | 0.70 | | 99.5 | 78.2 | 72 | 19.5 | 46 | 75 | ○ | ○ |
| | 11 | 96.60 | | 0.15 | 1.75 | 1.50 | | 99.4 | 77.9 | 71 | 18.2 | 48 | 72 | ○ | ○ |
| | 12 | 96.60 | | 0.40 | 0.50 | 2.50 | | 99.9 | 68.4 | 69 | 17.0 | 50 | 65 | ○ | ○ |
| Comparative Example | 1 | 96.50 | | | 3.50 | | | 89.2 | 31.7 | 72 | 21.1 | 44 | 78 | ○ | X |
| | 2 | 97.00 | | | | | 3.00 | 7.0 | 0.0 | 70 | 21.4 | 40 | 80 | ○ | X |
| | 3 | 60.00 | 40.0 | | | | | 98.6 | 70.8 | 84 | 17.3 | 53 | 71 | X | X |
| | 4 | 90.85 | | 0.15 | 9.00 | | | 97.6 | 82.1 | 74 | 17.5 | 67 | 42 | X | X |
| | 5 | 90.70 | | 0.30 | 9.00 | | | 98.0 | 83.0 | 70 | 17.4 | 70 | 37 | X | X |
| | 6 | 94.85 | | 0.15 | 5.00 | | | 98.7 | 81.3 | 71 | 20.2 | 55 | 51 | X | X |
| | 7 | 94.70 | | 0.30 | 5.00 | | | 99.0 | 82.5 | 70 | 20.0 | 57 | 48 | X | X |

Symbol ○ represents satisfactory results, and symbol X represents unsatisfactory result.

As shown in Table 1, each of the Sn—Ni containing solders of Examples 1 to 12 has satisfactory results, that is, a residual area rate of electrode of 95% or more, an expansion rate of 65% or more, a bonding strength of 17 N or more, a tensile strength of solder of 30 or more, a solder contraction of 55 or more and superior thermal impact resistance.

Although each of the solders of Comparative Examples 3 to 7 has a residual area rate of electrode of 95% or more, cracks form in the thermal impact test. Solder contraction is in a range of 42 to 51% and low in Comparative Examples 4 to 7. Thus, these are outside the range of the present invention.

Comparative Example 3 containing 40 percent by weight of lead is outside the range of the present invention.

The solders of Comparative Examples 1 and 2 have satisfactory solder contraction and thermal impact resistance; however, the residual area rates of the 20 copper electrode are 89.2% and 7.0%, respectively, and the residual area rates of the silver electrode are 31.7% and 0%, respectively. Thus, these solders are outside the range of the present invention.

While the invention has been particularly shown and described with reference to preferred embodiments thereof, it will be understood by those skilled in the art that the forgoing and other changes in form and details may be made therein without departing from the spirit of the invention.

What is claimed is:

1. A lead-free solder consisting essentially of about 0.01 to 0.5 percent by weight of nickel; at least one component selected about 0.7 to 2.0 percent by weight of copper and optionally about 3.0 to 5.0 percent by weight of antimony; and the balance being tin.

2. A soldered article comprising:

a workpiece containing a transition metal conductor capable of readily diffusing into melted tin;

a lead-free solder according to claim 1, the lead-free solder bonded to the workpiece so as to be electrically and mechanically bonded to the transition metal conductor.

3. The soldered article according to claim 2, wherein the transition metal conductor is at least one component selected from the group consisting of copper, silver, nickel, gold, palladium, platinum, zinc and an alloy thereof.

4. The soldered article according to claim 2, wherein the transition metal conductor is at least one component selected from the group consisting of copper, silver, nickel and an alloy thereof.

* * * * *